(12) United States Patent
Hayashi et al.

(10) Patent No.: US 11,024,599 B2
(45) Date of Patent: Jun. 1, 2021

(54) SEMICONDUCTOR DEVICE AND METHOD OF MANUFACTURING THEREOF

(71) Applicant: RENESAS ELECTRONICS CORPORATION, Tokyo (JP)

(72) Inventors: Ryo Hayashi, Tokyo (JP); Yasuhiko Akaike, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/654,862

(22) Filed: Oct. 16, 2019

(65) Prior Publication Data

US 2020/0185353 A1   Jun. 11, 2020

(30) Foreign Application Priority Data

Dec. 5, 2018   (JP) .............................. JP2018-227953

(51) Int. Cl.
    *H01L 23/00*    (2006.01)
(52) U.S. Cl.
    CPC .............. *H01L 24/85* (2013.01); *H01L 24/05* (2013.01); *H01L 24/45* (2013.01); *H01L 24/48* (2013.01); *H01L 2224/04042* (2013.01); *H01L 2224/05624* (2013.01); *H01L 2224/45144* (2013.01); *H01L 2224/4845* (2013.01); *H01L 2224/48175* (2013.01); *H01L 2224/48624* (2013.01); *H01L 2224/8503* (2013.01); *H01L 2224/85013* (2013.01); *H01L 2224/85205* (2013.01)

(58) Field of Classification Search
    CPC . H01L 2224/04042; H01L 2224/48624; H01L 2224/85013
    See application file for complete search history.

(56) References Cited

U.S. PATENT DOCUMENTS

2003/0192943 A1* 10/2003 Sudijono ................. H01L 24/03
                                                              228/180.5

FOREIGN PATENT DOCUMENTS

JP          2000-340596 A      12/2000

* cited by examiner

*Primary Examiner* — Daniel P Shook
(74) *Attorney, Agent, or Firm* — McDermott Will & Emery LLP

(57) ABSTRACT

The reliability of semiconductor device is improved. The method of manufacturing a semiconductor device has a step of performing plasma treatment prior to the wire bonding step, and the surface roughness of the pads after the plasma treatment step is equal to or less than 3.3 nm.

18 Claims, 21 Drawing Sheets

C (MAINLY ALLOYING)

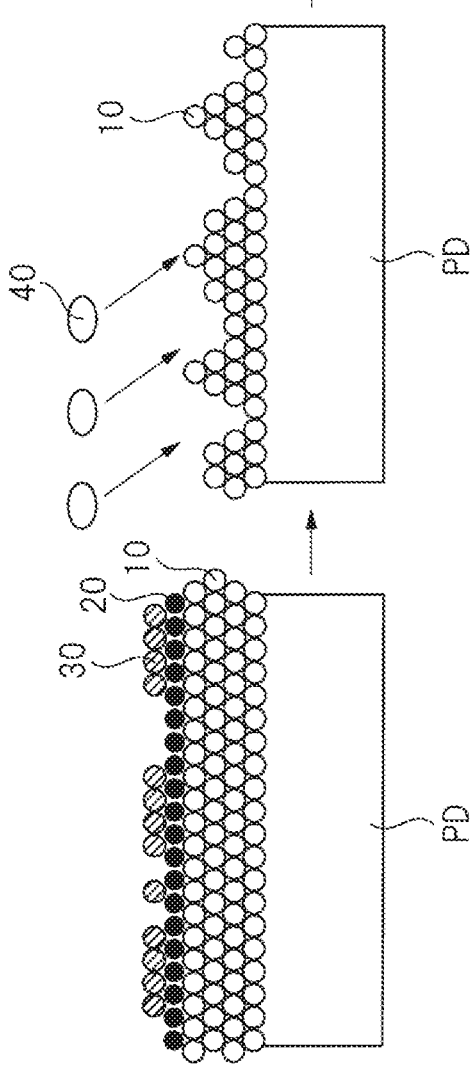

FIG. 9

| DISCHARGE PRESSURE | HIGH-FREQUENCY POWER (RF POWER) | |
|---|---|---|
| | 250W | 500W |
| 12Pa | THICKNESS OF OXIDE FILM MIDDLE | THICKNESS OF OXIDE FILM LARGE |
| 17Pa | THICKNESS OF OXIDE FILM SMALL | THICKNESS OF OXIDE FILM MIDDLE |

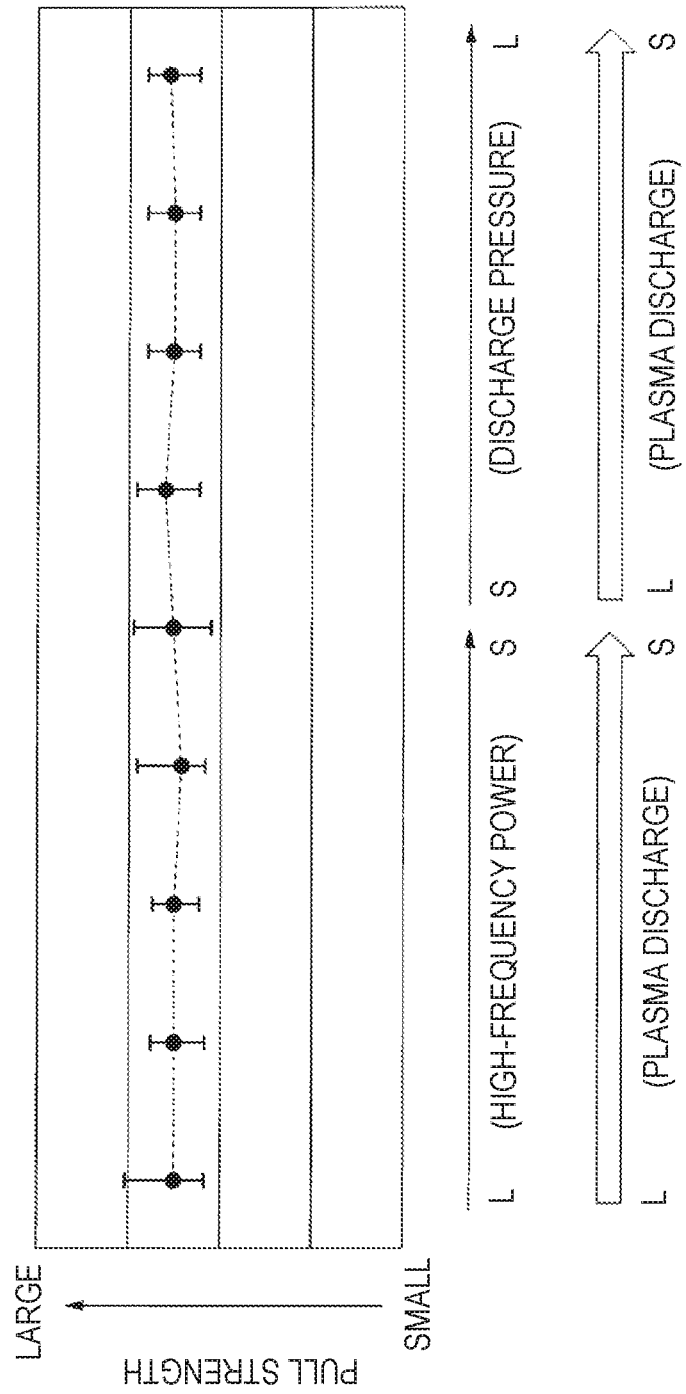

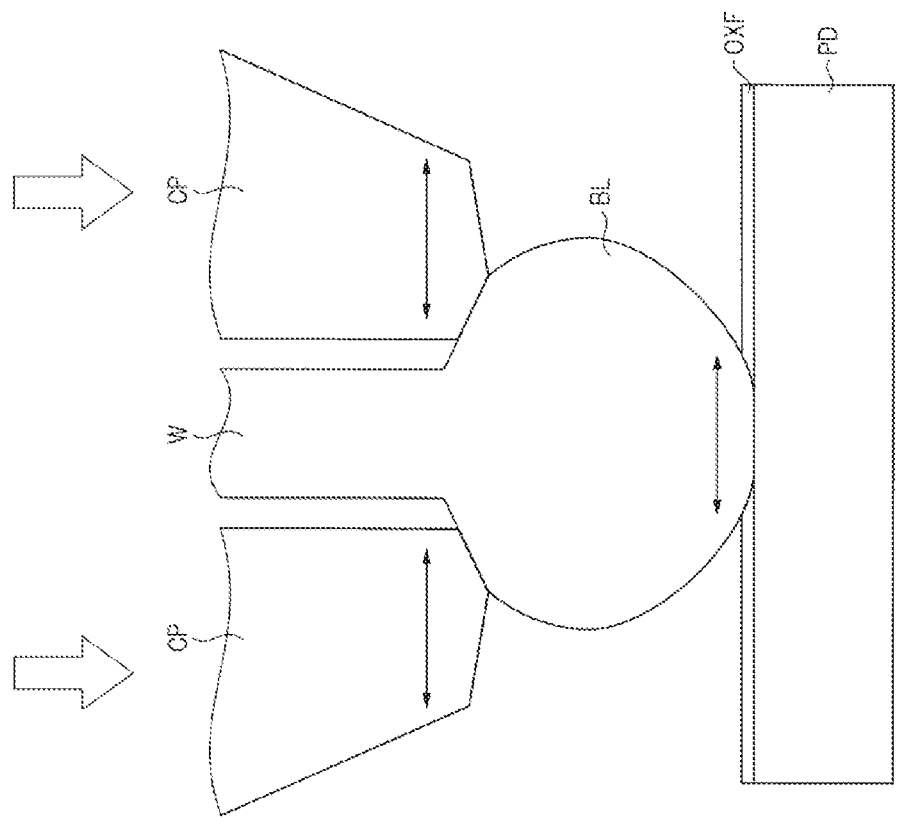

SEMICONDUCTOR DEVICE AND METHOD OF MANUFACTURING THEREOF

CROSS-REFERENCE TO RELATED APPLICATIONS

The disclosure of Japanese Patent Application No. 2018-227953 filed on Dec. 5, 2018 including the specification, drawings and abstract is incorporated herein by reference in its entirety.

BACKGROUND

The present invention relates to semiconductor device and method of manufacturing thereof, for example, the present invention relates to a semiconductor device having a wire and a technique useful for the manufacturing technique thereof.

Japanese Patent Application Laid-Open No. 2000-340596 describes a technique having a plasma cleaning step before a wire bonding step.

SUMMARY

For example, in a semiconductor device having a lead, in order to suppress contamination, which is a factor that lowers the reliability of connecting the lead and the wire, the surface of the lead may be subjected to a plasma treatment for cleaning the surface of the lead prior to the wire bonding step.

However, the present inventors have newly found that the plasma treatment performed to clean the surface of the lead adversely affects the bonding strength between the pad and the wire formed on the surface of the semiconductor chip. Therefore, there is a demand for a device that does not reduce the bonding strength between the pad and the wire even if plasma treatment is performed before the wire bonding step.

Other objects and novel features will become apparent from the description of this specification and the accompanying drawings.

The manufacturing method of the semiconductor device in one embodiment has a step of performing a plasma treatment prior to the wire bonding step, and the surface roughness of the pad after the plasma treatment step is equal to or less than 3.3.

According to one embodiment, the reliability of the semiconductor device can be improved.

BRIEF DESCRIPTION OF THE DRAWINGS

FIGS. 7A to 7C are a diagram schematically illustrating a plasma treatment when the high frequency power is large.

FIG. 9 is a table showing the relative film thickness of the oxide film formed on the surface of the pad when the high frequency power and discharge pressure in the plasma treatment are varied.

FIG. 13 is a graph showing the relationship between tensile strength between the inner lead and the wire and the plasma condition.

FIG. 15 shows the bonding state of the wire bonding process.

DETAILED DESCRIPTION

Figure 1:
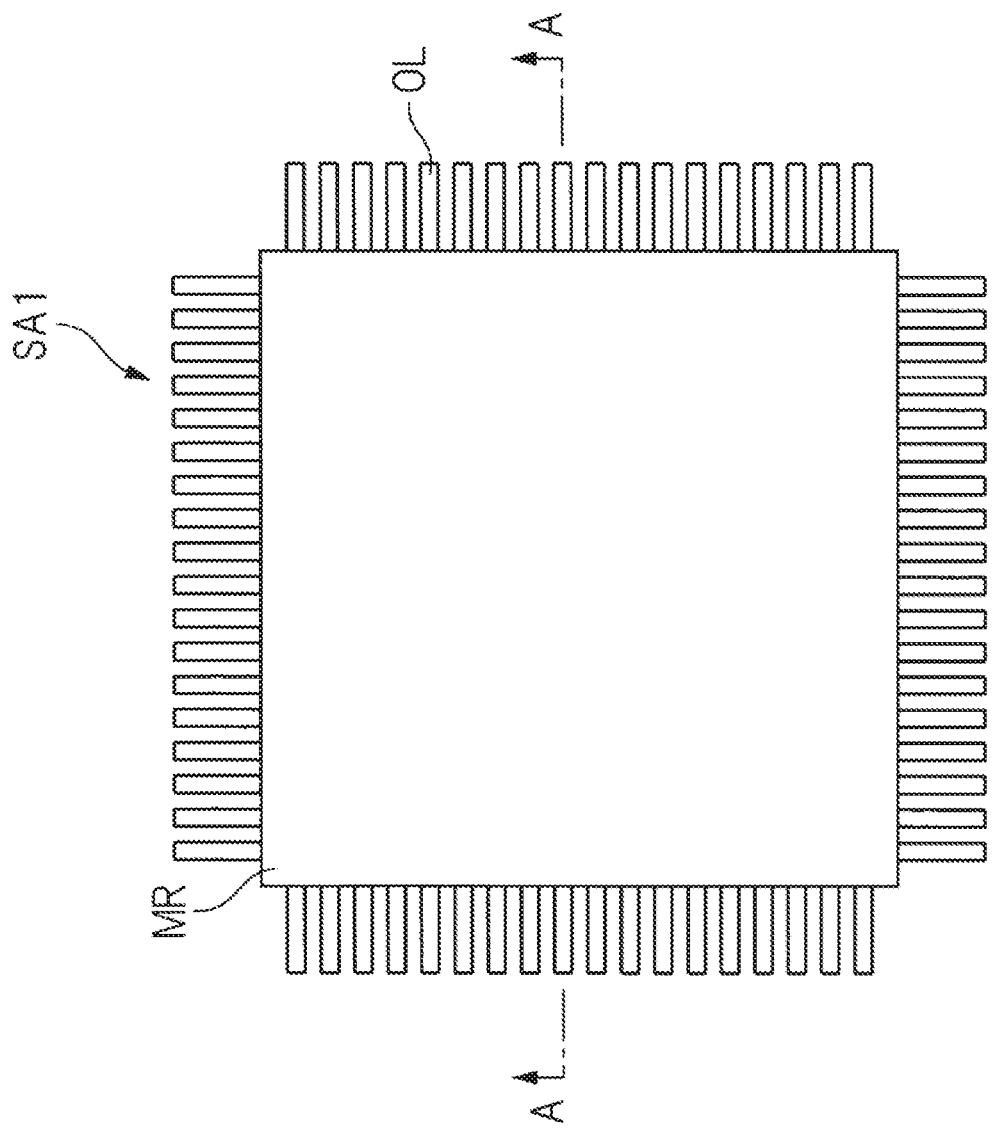
FIG. 1 is a plan view seen from an upper surface of QFP type semiconductor device.

In the following embodiments, when required for convenience, the description will be made by dividing into a plurality of sections or embodiments, but except when specifically stated, they are not independent of each other, and one is related to the modified example, detail, supplementary description, or the like of part or all of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. Note that even plan view may be hatched for the sake of clarity.

Configuration Example of Semiconductor Device (QFP)

There are various types of package structures regarding semiconductor device such as a Ball Grid Array (BGA) package and a Quad Flat Package (QFP). The technical idea in the present embodiment is applicable to these packages, and the configuration of a semiconductor device composed of QFP will be described below.

FIG. 1 is a plan view of a semiconductor device SA1 composed of QFP as viewed from the upper surface. As shown in FIG. 1, the semiconductor device SA1 has a rectangular shape, and the upper surface of the semiconductor device SA1 is covered with a resin (sealing material) MR. The outer leads OL project outward from the four sides defining the outer shape of the resin MR.

Figure 2:
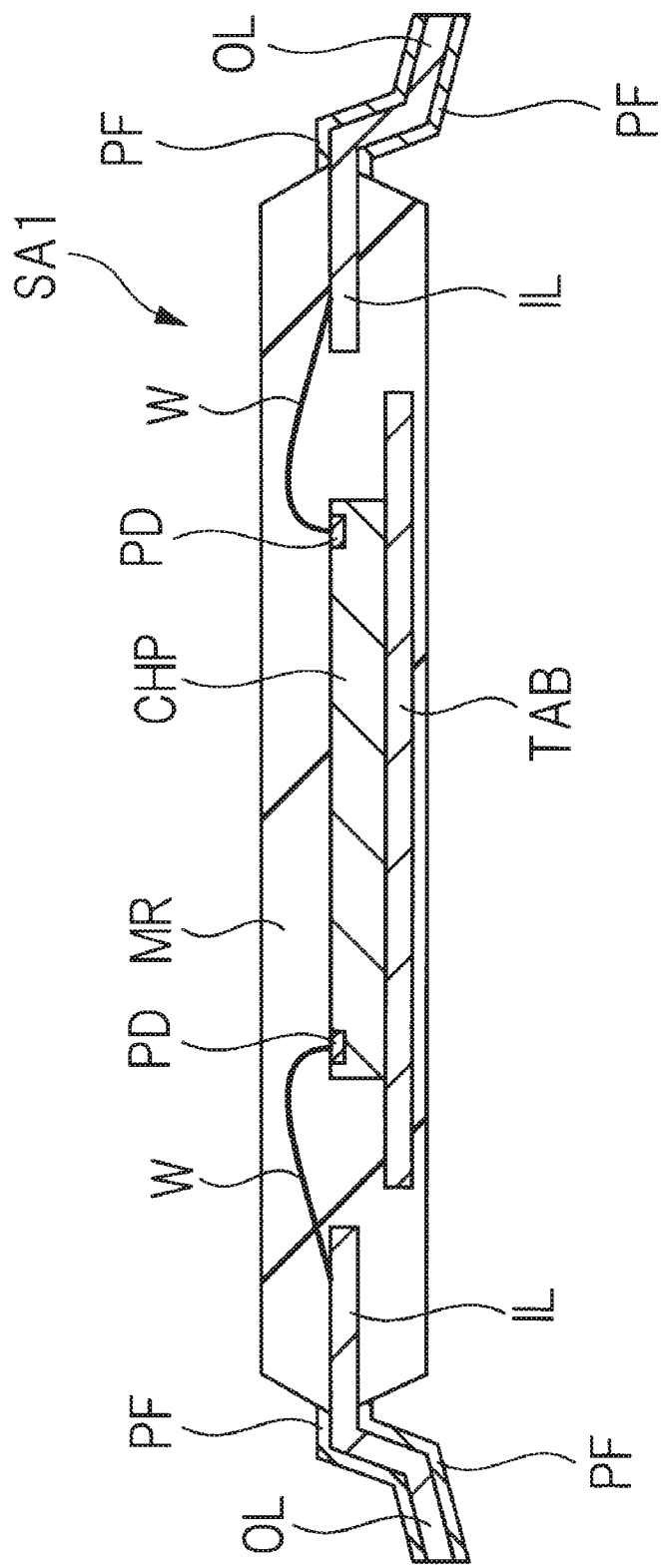
FIG. 2 is a cross-sectional view cut along the A-A line in FIG. 1.

Next, the inner structures of the semiconductor device SA1 will be described. FIG. 2 is a cross-sectional view taken along line A-A in FIG. 1. As shown in FIG. 2, the back surface of the chip mounting portion TAB is covered with the resin MR. On the other hand, a semiconductor chip CHP is mounted on the upper surface of the chip mounting portion TAB, and the chip mounting portion TAB is separated from the inner leads IL (lead terminals). Pad PD is formed on the main surface of the semiconductor chip CHP. The pad PD formed on the semiconductor chip CHP is electrically connected with the inner leads IL via the wire W. The semiconductor chip CHP, the wire W, and the inner lead IL are covered with a resin MR, and an outer lead OL (lead terminal) integrated with the inner lead IL protrudes from the resin MR. The outer lead OL protruding from the resin MR is molded into a gull wing shape, and a plating film PF is formed on the surface of the outer lead OL.

The chip mounting portion TAB, the inner lead IL, and the outer lead OL are formed of, for example, a copper material or 42 Alloy which is an alloy of iron and nickel, and the wire W is formed of, for example, a material containing gold as a main component. The semiconductor chip CHP is formed of, for example, silicon or a compound semiconductor such as GaAs, and a plurality of semiconductor elements such as MOSFET are formed on the semiconductor chip CHP. A multilayer wiring is formed above the semiconductor element via an interlayer insulating film, and a pad PD connected to the multilayer wiring is formed on the uppermost layer of the multilayer wiring. Therefore, the semiconductor element formed on the semiconductor chip CHP is electrically connected to the pad PD via the multilayer wiring. That is, an integrated circuit is formed by the semiconductor element formed on the semiconductor chip CHP and the multilayer wiring, and the pad PD functions as a terminal for connecting the integrated circuit and the outside of the semiconductor chip CHP. The pad PD is made of, for example, a material containing aluminum as a main component. The pad PD is connected to the inner lead IL by a wire W, and is connected to the outer lead OL formed integrally with the inner lead IL. From this, it is understood that the integrated circuit formed in the semiconductor chip CHP can be electrically connected with the outside of the semiconductor device SA1 by way of "the pad PD→the wire W→the inner lead IL→the outer lead OL→the external connecting device". That is, by inputting electric signals from the outer leads OLs formed on the semiconductor device SAs 1, the integrated circuits formed on the semiconductor chips CHPs can be controlled. It is also understood that an output signal from the integrated circuit can be taken out from the outer lead OL to the outside.

Figure 3:
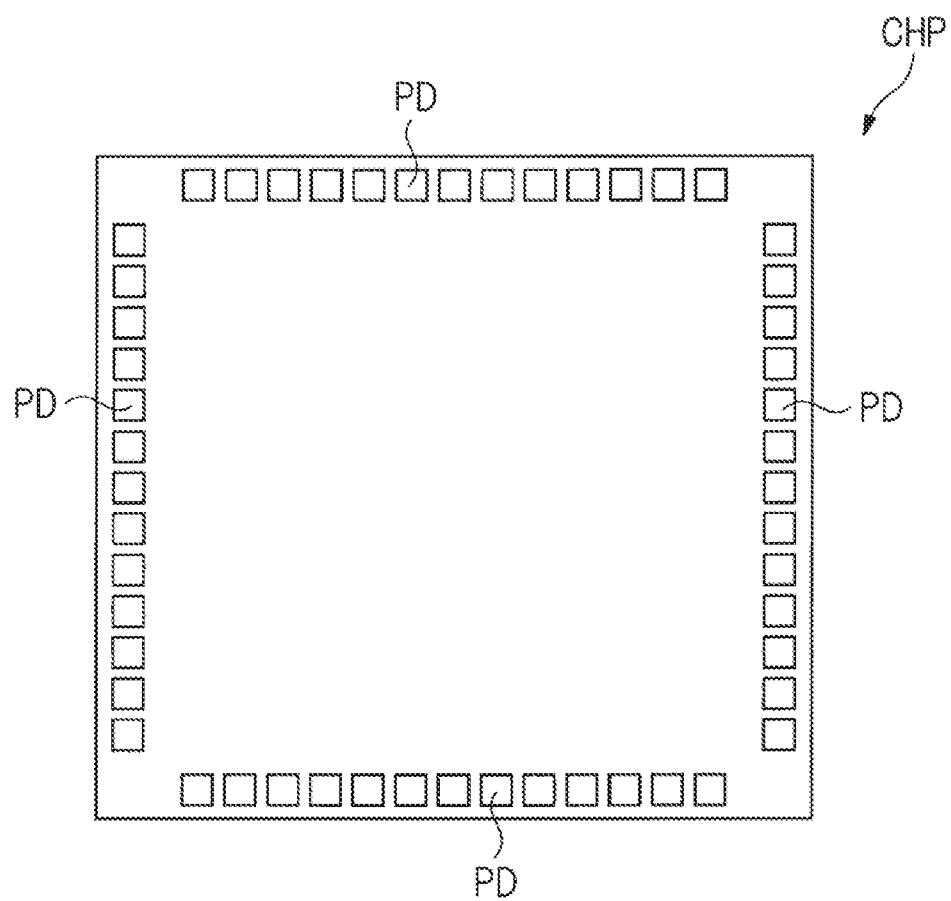
FIG. 3 shows a layout configuration of a semiconductor chip.

Next, FIG. 3 is a diagram showing a layout configuration of the semiconductor chip CHP. In FIG. 3, the semiconductor chip CHP has, for example, a rectangular shape, and a plurality of pads PD is arranged along the edge of the semiconductor chip CHP. In each of the plurality of pads PD, although not shown in FIG. 3, most of the surface of the pad PD is exposed from the surface protective film at an opening provided in the surface protective film, while the end portion of the pad PD is covered with the surface protective film.

<Method of Manufacturing Semiconductor Device (QFP)>

The semiconductor device SA1 composed of the QFP is configured as described above, and the manufacturing method thereof will be briefly described below.

Figure 4:
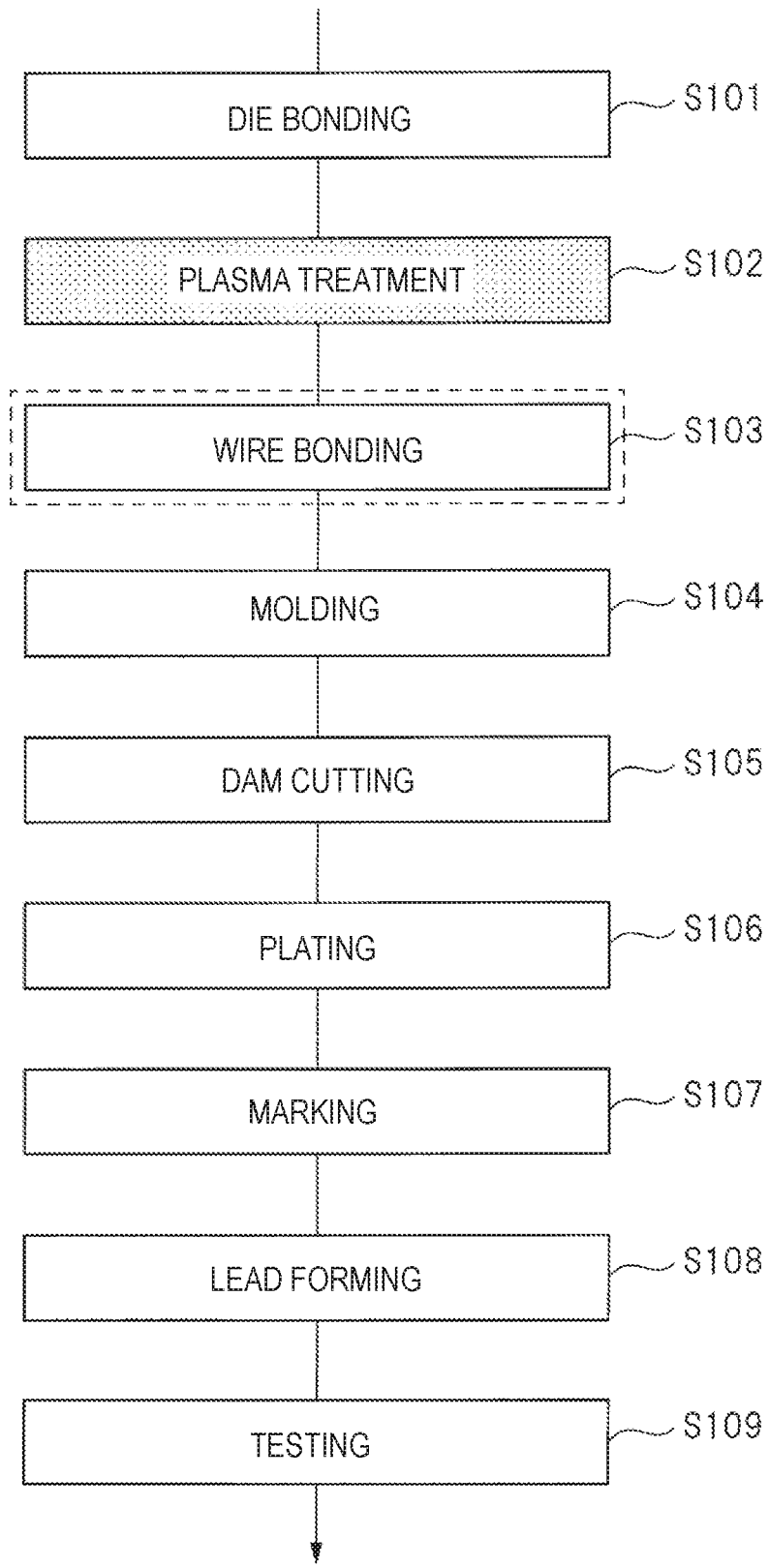
FIG. 4 is a flow chart illustrating a process flow of manufacturing the QFP type semiconductor device after forming an integrated circuit in a semiconductor chip.

FIG. 4 is a flow chart showing a flow of a process of manufacturing a semiconductor device including QFPs after integrated circuits are formed on semiconductor chips.

First, after a semiconductor chip is mounted on a chip mounting portion of a lead frame (S101 die bonding), a plasma treatment (plasma cleaning) is performed (S102). Next, the pad formed on the semiconductor chip and the inner lead are connected with each other via the wire (S103 wire bonding). Specifically, first, the capillary is pressed against a pad formed on the semiconductor chip and bonded. Thereafter, the capillary is moved to bond the wire to the inner lead (second bonding). In this manner, the pad formed on the semiconductor chip and the inner lead of the lead frame can be connected with each other via the wire.

Thereafter, the chip mounting portion, the semiconductor chip, the wire, and the inner lead are sealed with a resin (S104 molding). After the dam formed on the lead frame is cut (S105 dam cutting), a plating film is formed on the surfaces of the outer leads exposed from the resins (S106 plating). Subsequently, after marks are formed on the surfaces of the resin (marking of the S107), outer leads protruding from the resin are formed (lead forming of the S108). After the semiconductor device SA1 is formed in this manner, an electric property test is performed (S109 testing), and the semiconductor device SA1 judged to be a good product is shipped as a product.

<Details of Wire Bonding Step>

Next, details of the above-described wire bonding process will be described with reference to the drawings.

Figure 5:
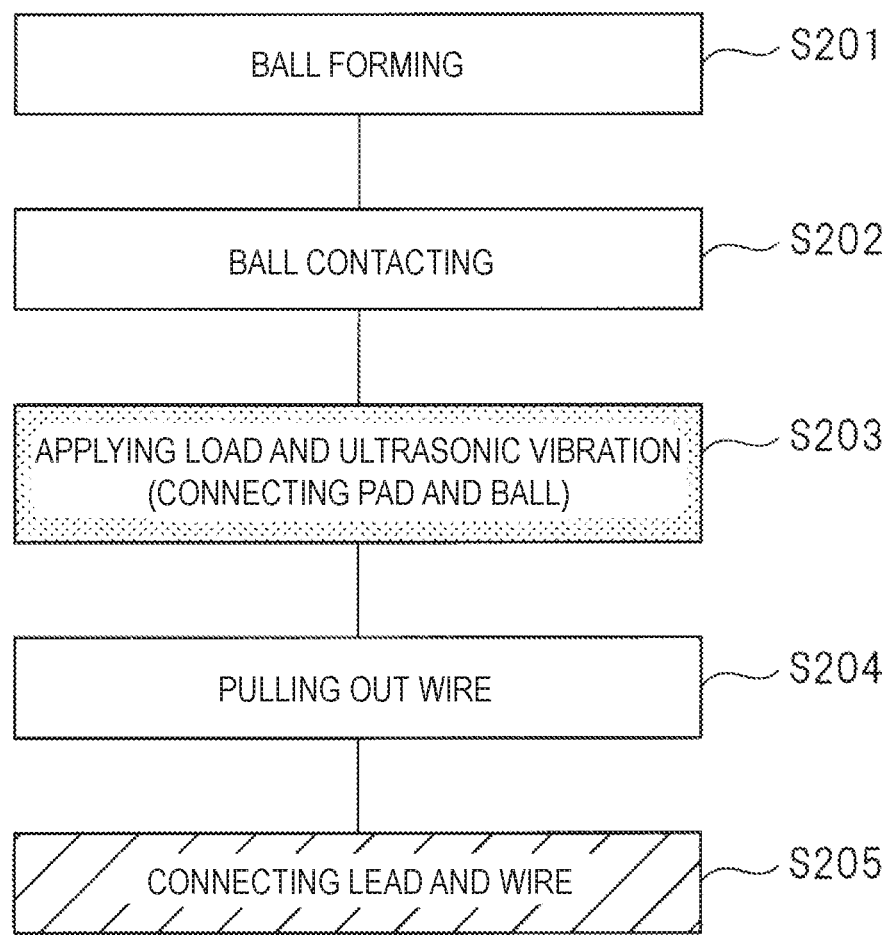
FIG. 5 is a flow chart illustrating the flow of the wire bonding process.

FIG. 5 is a flowchart for explaining the flow of the wire bonding process. First, a ball is formed on the distal end portion of the wire drawn out from the capillary by discharge torching (S201). Then, the ball formed at the distal end portion of the capillary is arranged on the pad of the semiconductor chip mounted on the chip mounting portion so as to contact with the pad (S202). At this time, a load and ultrasonic vibration are applied to the capillary, and the ball arranged on the pad of the semiconductor chip is deformed by the load applied to the capillary and the ultrasonic vibration, thereby bonding between the pad and the ball is performed (first bonding) (S203).

Figure 6:
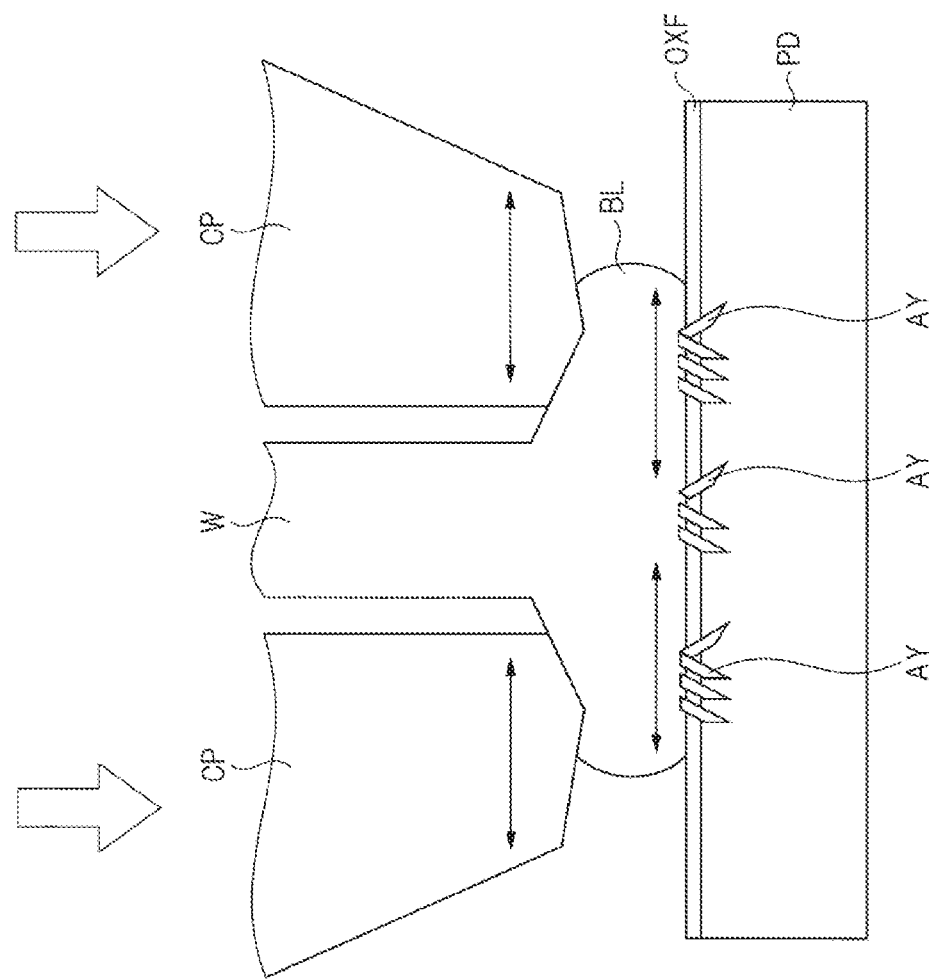
FIG. 6 is a schematic diagram showing a state where the pad and the ball are bonded with each other by first bonding

Specifically, FIG. 6 is a schematic diagram showing a state in which a pad and a ball are bonded to each other by first bonding. As shown in FIG. 6, for example, an oxide film OXF is formed on the surface of the pad PD made of a material containing aluminum as a main component. Then, the ball BL formed at the tip of the wire W made of, for example, a material containing gold as a main component is landed on the oxide film OXF by the capillary CP. At this time, a load and ultrasonic vibration are applied to the capillary CP, and a part of the oxide film OXF in contact with the ball BL is broken by the ultrasonic vibration, so that the ball BL and the pad PD directly contact each other, and a load is applied to the ball BL, whereby an alloy AY of gold constituting the ball BL and aluminum comprising the pad PD is formed. In this manner, bonding between the pad and the ball is performed.

Next, the capillary is moved while the wire is pulled out from the capillary at the position where the pad on the semiconductor chips is formed (S204). Then, a wire is bonded to the inner lead using the capillary (second bonding) (S205). Thereafter, the second bonded wire is cut from the capillary. In this manner, the pad formed on the semiconductor chip and the inner lead of the lead frame can be connected with each other via the wire.

<Study of Improvement>

Next, the scope of improvement newly found by the present inventor will be described.

For example, in the wire bonding process, although the pad and the ball are bonded, the inventor of the present invention has newly found that a decrease in the bonding strength between the pad and the ball becomes apparent as a room for improvement. In this regard, first, it was considered that there is a cause of the bonding condition in the wire bonding process, and therefore, only the change of the bonding condition was attempted to cope with the room for the improvement of the lowering of the bonding strength between the pad and the ball, but a satisfactory result could not be obtained. From this, the present inventors have considered that there is another essential cause of the decrease in the bonding strength between the pad and the ball, and as a result of further intensive investigation, have found that there is a cause of the plasma treatment performed before the wire bonding step.

This plasma treatment is performed, for example, for the purpose of suppressing a decrease in bonding property (a decrease in pull strength (tensile strength)) caused by contamination on the surface of the inner lead at the time of second bonding in which a wire is bonded to the inner lead. However, the present inventor has newly found that the bonding strength between the pad and the ball is adversely affected by the plasma treatment performed for the above-mentioned purpose. Hereinafter, a mechanism by which the plasma treatment adversely affects the bonding strength between the pad and the ball will be described.

FIG. 7 is a diagram schematically illustrating a plasma treatment in the case where, for example, high-frequency power is large. First, before the plasma treatment is performed, contamination is formed on the surface of the inner lead, and contamination is also formed on the surface of the pad PD. Specifically, for example, as shown in FIG. 7A, the oxide 20 is formed on the aluminum atom 10 comprising the pad PD, and the carbide 30 is formed on the oxide 20. In this state, for example, when plasma treatment is performed as shown in FIG. 7B, contamination represented by the oxide 20 and the carbide 30 is removed by sputtering with the argon atom 40, and the surface roughness of the pad PD made of the aluminum atom 10 is also roughened. This is because that since the high-frequency power is large, the kinetic energy of the argon atom 40 used in the plasma treatment is also increased. That is to say, since not only the oxide 20 and the carbide 30 but also the aluminum atom 10 comprising the pad PD are greatly affected by the sputtering by the argon, the surface roughness of the pad PD made of the aluminum atom 10 is roughened. Thereafter, when the plasma treatment is completed, for example, as shown in FIG. 7C, an oxide 50 comprising a native oxide film is formed on the surface of the pad PD. At this time, in the plasma treatment in the case where the high-frequency power is large, the surface roughness of the pad PD becomes rough, and as a result, as shown in FIG. 7C, the effective thickness L1 of the oxide film including the oxide 50 formed on the surface of the pad PD becomes thick.

The increase in the thickness of the oxide film formed on the surface of the pad PD means that, for example, in FIG. 6, the thickness of the oxide film OXF formed between the pad PD and the ball BL is increased. In this case, even if ultrasonic vibration is applied from the capillary CP to the ball BL, the oxide film OXF is not sufficiently removed because of the large thickness of the oxide film OXF. As a result, direct contact between the ball BL and the pad PD is inhibited by the oxide film OXF remaining without being sufficiently removed. This means that the alloying of gold and aluminum due to the direct contact between the ball BL and the pad PD is inhibited, thereby decreasing the bonding strength between the ball BL and the pad PD. By the mechanism described above, when the high-frequency power of the plasma treatment is large, there is a room for improvement in that the bonding strength between the ball BL and the pad PD is lowered.

Therefore, present embodiment has devised the above-mentioned room for improvements. Hereinafter, the technical idea in the present embodiment to which the present invention is applied will be described.

Basic Idea in Present Embodiment

The basic idea in present embodiment is to reduce the surface roughness of the pad PD as much as possible by adjusting the plasma condition (condition of the plasma treatment (plasma cleaning)) at the time of performing the plasma treatment. That is, the basic idea in the present embodiment is to reduce the surface roughness of the pad PD by setting the plasma condition of the plasma treatment so that the surface roughness of the pad PD is less susceptible to sputtering of the aluminum comprising the pad PD.

Figure 8A:
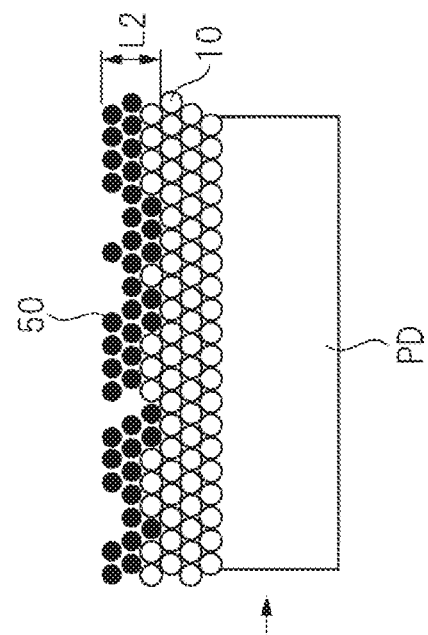
FIGS. 8A to 8C are a diagram schematically illustrating a plasma treatment when the high frequency power is small.
Figure 8B:
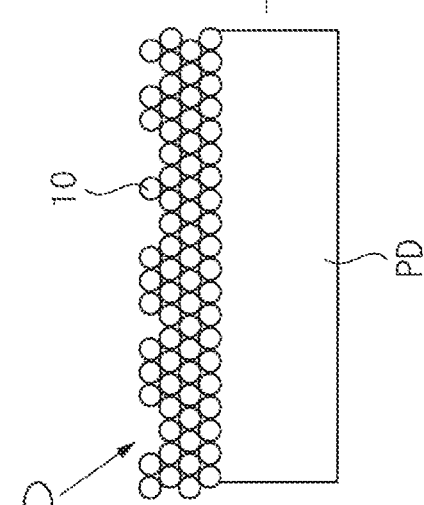
Figure 8C:
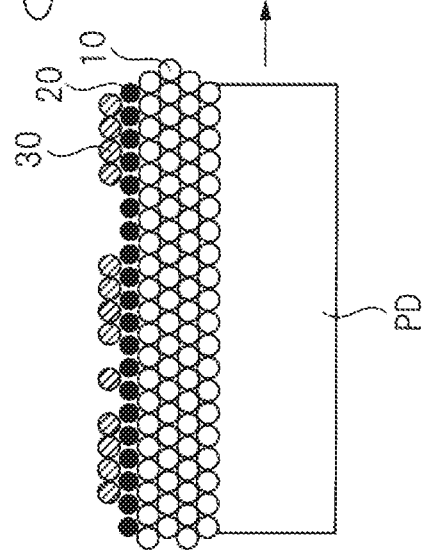

For example, FIG. 8 is a diagram schematically illustrating a plasma treatment in the case where the high-frequency power is small. First, before performing the plasma treatment, for example, as shown in FIG. 8A, the oxide 20 is formed on the aluminum atom 10 comprising the pad PD, and the carbide 30 is formed on the oxide 20. In this state, for example, when plasma treatment is performed as shown in FIG. 8B, contamination represented by the oxide 20 and the carbide 30 is removed by sputtering with the argon atom 40, and the surface of the pad PD made of the aluminum atom 10 is also removed. However, in the present embodiment, since the high-frequency power is small, the kinetic energy of the argon atom 40 used in the plasma treatment is small, and as a result, the aluminum atom 10 comprising the pad PD is less susceptible to sputtering by argon. As a result, according to the basic idea in present embodiment, the surface roughness of the pad PD can be reduced. Thereafter, when the plasma treatment is completed, for example, as shown in FIG. 8C, an oxide 50 comprising a native oxide film is formed on the surface of the pad PD. At this time, in the plasma treatment in the case where the high-frequency power is small, the surface roughness of the pad PD becomes small, and as a result, as shown in FIG. 8C, the effective thickness L2 of the oxide film including the oxide 50 formed on the surface of the pad PD becomes thin.

The fact that the thickness of the oxide film formed on the surface of the pad PD is reduced means that the thickness of the oxide film OXF formed between the pad PD and the ball BL is reduced in FIG. 6, for example. In this case, when ultrasonic vibration is applied from the capillary CP to the ball BL, the oxide film OXF can be sufficiently removed because the thickness of the oxide film OXF is small. As a result, direct contact between the ball BL and the pad PD is hardly inhibited by the oxide film OXF. This means that the alloying of gold and aluminum due to the direct contact between the ball BL and the pad PD is hardly hindered, whereby the lowering of the bonding strength between the ball BL and the pad PD can be suppressed.

By the mechanism described above, when the high-frequency power of the plasma treatment is small, a decrease in the bonding strength between the ball BL and the pad PD is suppressed. Here, an example in which the high-frequency power of the plasma treatment is adjusted as an example in which the plasma condition (condition of the plasma treatment) is set so as to be less susceptible to the influence of the sputtering by the argon of the aluminum comprising the pad PD has been described. However, the basic idea in the present embodiment is essentially to reduce the surface roughness of the pad PD by making the pad PD less susceptible to sputtering of the aluminum comprising the pad PD. For this reason, the high-frequency power of the plasma treatment is not limited, and for example, the discharge pressure and the treatment time at the time of the plasma treatment can be adjusted. For example, in the case of adjusting the discharge pressure, as the discharge pressure increases, the collision of the argon atom 40 with the surface of the pad PD is suppressed, and therefore, by adjusting the plasma condition so as to increase the discharge pressure, it is possible to make the pad PD less susceptible to the influence of sputtering by argon of aluminum comprising the pad PD. In addition, since the collision of the argon atom 40 with the surface of the pad PD is suppressed by shortening the processing time of the plasma treatment, by adjusting the plasma condition so as to shorten the processing time of the plasma treatment, it is possible to make the aluminum comprising the pad PD less susceptible to the influence of the sputtering by the argon. As described above, for example, by adjusting the high-frequency power, the discharging pressure, and the treatment time, it is possible to realize the basic idea in the present embodiment of reducing the surface roughness of the pad PD by making the pad PD less susceptible to the effect of the sputtering by the argon of the aluminum comprising the pad PD.

The basic idea in such a present embodiment is not to focus on the wire bonding process in order to improve the bonding strength between the pad and the ball, but to focus on the plasma treatment process, which is a separate process from the wire bonding process, and to adjust the plasma condition of the plasma treatment. Furthermore, the basic idea in present embodiment is novel in that it is based on the correlation between the surface roughness of the pad and the thickness of the oxide film (see FIGS. 7 and 8), and in order to reduce the thickness of the oxide film, the plasma condition of the plasma treatment should be set based on the new policy of reducing the surface roughness of the pad.

Illustrative Example

FIG. 9 is a table showing the relative film thickness of the oxide film formed on the surface of the pad when the high-frequency power and the discharge pressure in the plasma treatment are changed. In FIG. 9, first, when the high-frequency power is 500 W and the discharge pressure is 12 Pa, the high-frequency power is large and the discharge pressure is low, so that the thickness of the oxide film formed on the surface of the pad is large.

Next, when the high-frequency power is set to 500 W and the discharge pressure is increased to 17 Pa, the discharge pressure increases, so that the thickness of the oxide film formed on the surface of the pad becomes moderate. When the high-frequency power is reduced to 250 W and the discharge pressure is 12 Pa, the high-frequency power is reduced, so that the thickness of the oxide film formed on the surface of the pad is moderate.

Further, when the high-frequency power is reduced to 250 W and the discharge pressure is increased to 17 Pa, the high-frequency power is reduced and the discharge pressure is increased, so that the thickness of the oxide film formed on the surface of the pad is reduced.

Figure 10:
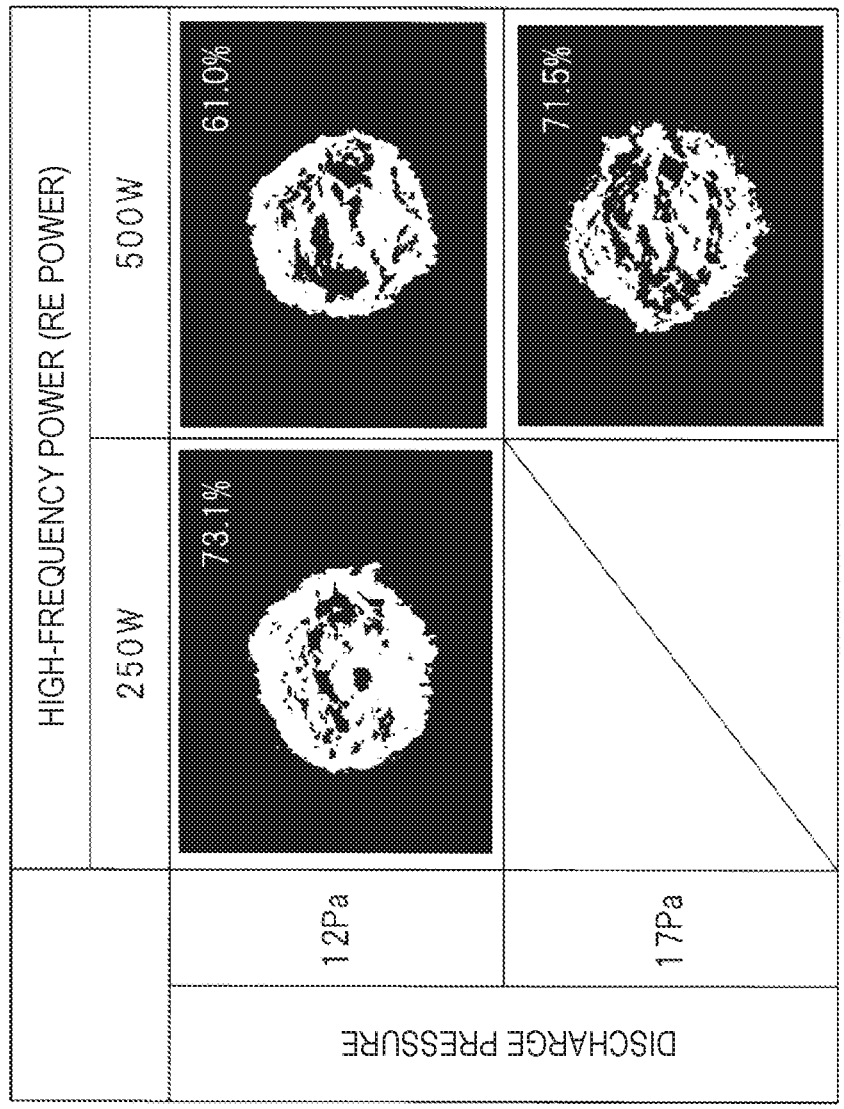
FIG. 10 is a diagram showing the rate of alloying between the pad and the ball when the high frequency power and discharge pressure in the plasma treatment are varied.

FIG. 10 is a graph showing the alloying rate between the pad and the ball when the high-frequency power and the discharge pressure in the plasma treatment are changed. First, when the high-frequency power is 500 W and the discharge pressure is 12 Pa, the high-frequency power is large and the discharge pressure is low, so that the thickness of the oxide film formed on the surface of the pad is large. As a result, as shown in FIG. 10, the alloying ratio between the pad and the ball is 61.0%. On the other hand, when the high-frequency power is set to 500 W and the discharge pressure is increased to 17 Pa, the discharge pressure increases, so that the thickness of the oxide film formed on the surface of the pad becomes moderate. As a result, as shown in FIG. 10, the alloying ratio between the pad and the ball is 71.5%. Further, when the high-frequency power is reduced to 250 W and the discharge pressure is 12 Pa, the high-frequency power is reduced, so that the thickness of the oxide film formed on the surface of the pad is moderate. As a result, as shown in FIG. 10, the alloying ratio between the pad and the ball is 73.1%.

From the above, it is understood that when the thickness of the oxide film is reduced, the alloying rate between the pad and the ball is improved. That is, it is understood that there is a correlation between the thickness of the oxide film formed on the surface of the pad and the alloying rate between the pad and the ball. As described above, it is understood that the basic idea in the present embodiment of reducing the surface roughness of the pad PD by adjusting the plasma condition typified by the high-frequency power and the discharge pressure contributes to the improvement of the alloying rate between the pad and the ball by reducing the thickness of the oxide film formed on the surface of the pad PD. That is, according to the basic idea in present embodiment, it is possible to improve the bonding strength between the pad and the ball.

Figure 11:
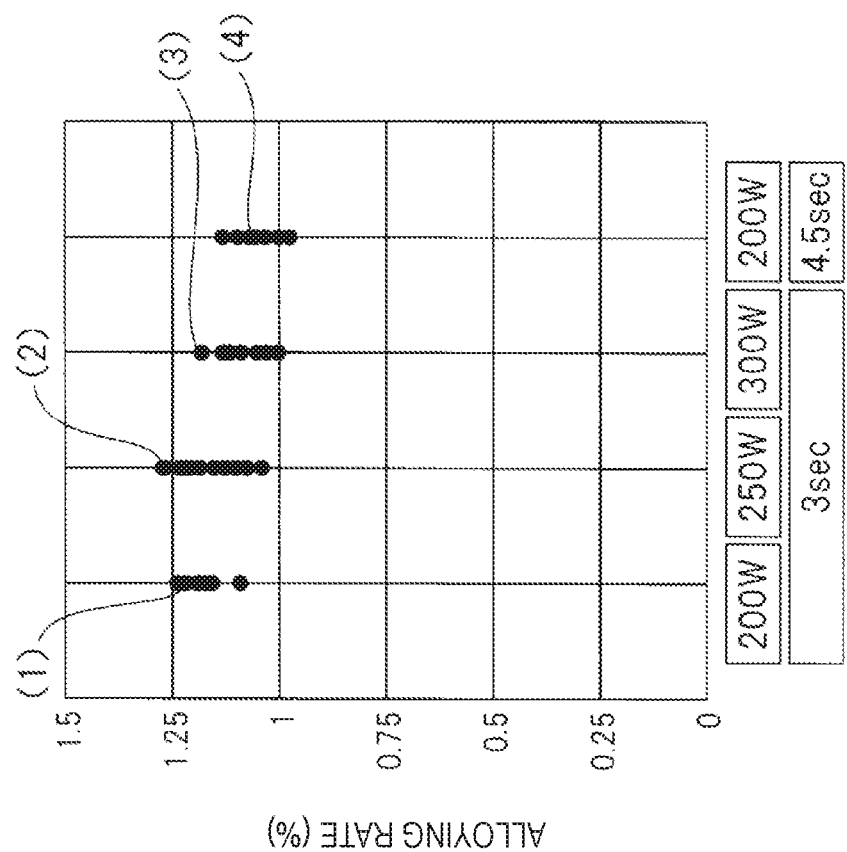
FIG. 11 is a graph showing the relationship between the plasma condition including high frequency power and processing time and the alloying rate between the pad and the ball.

Next, FIG. 11 is a graph showing the relationship between the plasma condition including the high-frequency power and the processing time, and the alloying rate between the pad and the ball. In FIG. 11, a graph (1) shows data of the alloying rate when the high-frequency power is 200 W and the processing time is 3 seconds, and a graph (2) shows data of the alloying rate when the high-frequency power is 250 W and the processing time is 3 seconds. In FIG. 11, the graph (3) shows data of the alloying rate when the high-frequency power is 300 W and the processing time is 3 seconds, and the graph (4) shows data of the alloying rate when the high-frequency power is 200 W and the processing time is 4.5 seconds. First, in FIG. 11, when attention is paid to graphs (1) to (3), it can be seen that the alloying rate between the pad and the ball decreases when the high-frequency power is increased in a state in which the processing time of the plasma treatment is constant (3 seconds). This is a result of supporting a qualitative mechanism in which the kinetic energy of the argon atom increases as the high-frequency power increases, the sputtering effect of the argon atom on the aluminum comprising the pad increases, and the surface roughness of the pad becomes rough, so that the alloying rate decreases through thickening of the oxide film.

Next, in FIG. 11, when the graph (1) and the graph (4) are focused, it can be seen that the alloying rate between the pad and the ball decreases when the processing time is lengthened in a state in which the high-frequency power is kept constant (200 W). This is a result of supporting a qualitative mechanism in which, as the processing time becomes longer, the sputtering time by the argon atom on the aluminum comprising the pad becomes longer and the surface roughness of the pad becomes rougher, so that the alloying rate decreases through thickening of the oxide film. From the above, it is understood that, in order to improve the alloying rate between the pad and the ball, it is effective to reduce the high-frequency power as the plasma condition and to shorten the processing time of the plasma treatment.

Figure 12:
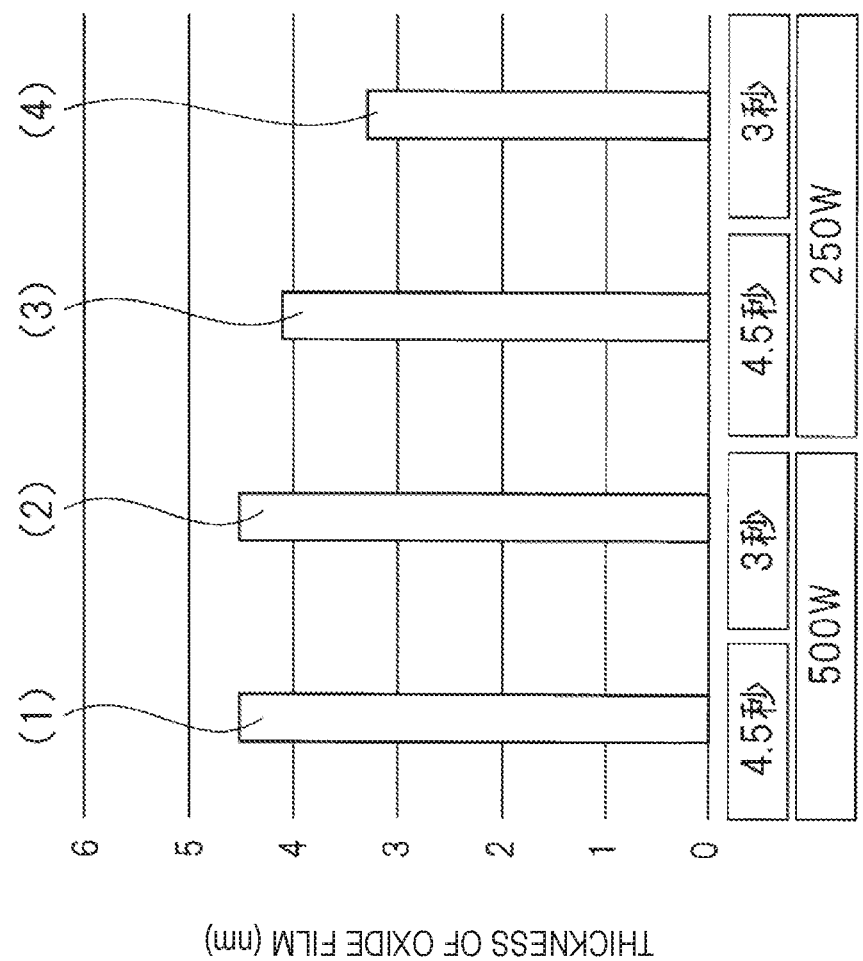
FIG. 12 is a graph showing the relationship between the plasma condition including high-frequency power and processing time and the film thickness of the oxide film formed on the surface of the pad.

Next, FIG. 12 is a graph showing the relationship between the plasma condition including the high-frequency power and the processing time, and the film thickness of the oxide film formed on the surface of the pad. In FIG. 12, graph (1) shows the film thickness data of the oxide film when the high-frequency power is 500 W and the treatment time is 4.5 seconds, and graph (2) shows the film thickness data of the oxide film when the high-frequency power is 500 W and the treatment time is 3 seconds. In FIG. 12, graph (3) shows the film thickness data of the oxide film when the high-frequency power is 250 W and the treatment time is 4.5 seconds, and graph (4) shows the film thickness data of the oxide film when the high-frequency power is 250 W and the treatment time is 3 seconds.

As shown in FIG. 12, comparing the graph (1) showing the conventional plasma condition with the graph (4) showing the plasma condition at present embodiment, it is understood that the thickness of the oxide film is 4.4 nm in the graph (1) showing the conventional plasma condition, whereas the thickness of the oxide film is reduced to 3.3 nm in the graph (4) showing the plasma condition at present embodiment. As described above, the results shown in FIG. 12 confirm that the thickness of the oxide film formed on the surface of the pad can be reduced by reducing the high-frequency power as the plasma condition and shortening the processing time of the plasma treatment.

Note that the thickness of the oxide film in FIG. 12 is estimated using Auger electron spectroscopy (Auger Electron Spectroscopy). Specifically, Auger electron spectroscopy is a method of analyzing an element comprising a sample surface, its composition, and a chemical bond state by irradiating a thinly focused electron beam on a sample surface and measuring kinetic energy of Auger electrons emitted from the sample surface. In present embodiment, the depth at which the aluminum atom concentration is 50% is defined as the thickness of the oxide film.

As described above, the present embodiment is characterized in that an oxide film of 3.3 nm or less is formed on the surface of the pad prior to the wire bonding step in the manufacturing method of the semiconductor device including the plasma treatment step of performing the plasma treatment on the semiconductor chip having the pad on the surface of the semiconductor chip, and the wire bonding step of connecting the wire to the pad after the plasma treatment step. As a result, the thickness of the oxide film formed between the pad and the ball is reduced, so that the oxide film can be easily removed by ultrasonic vibration applied to the ball. As a result, it is possible to suppress a decrease in the alloying rate between the pad and the ball due to the oxide film interposed between the pad and the ball.

In particular, in present embodiment, by adjusting the plasma condition in the plasma treatment, an oxide film with a thickness of 3.3 nm or less is formed on the surface of the pad prior to the wire bonding process. That is, in the present embodiment, since only an oxide film of 3.3 nm or less is formed on the surface of the pad prior to the wire bonding step by the plasma condition of the plasma treatment, alloying of the pad and the wire including the ball can be promoted. As a result, according to the present embodiment, it is possible to improve the connecting strength between the pad and the wire including the ball. At this time, the plasma condition may include high-frequency power, discharge pressure, and processing time.

Here, for example, as shown in FIG. 7, when the surface roughness of the pad PD is rough, the thickness L1 of the effective oxide film containing the oxide 50 formed on the surface of the pad PD becomes thick. On the other hand, as shown in FIG. 8, when the surface roughness of the pad PD is small, the effective thickness L2 of the oxide film including the oxide 50 formed on the surface of the pad PD becomes thin. At this time, for example, in FIG. 7, the thickness L1 of the oxide film can be regarded as the surface roughness of the pad PD. Similarly, in FIG. 8, the thickness L2 of the oxide film can be regarded as the surface roughness of the pad PD. Therefore, the characteristic point of present embodiment is that the surface roughness of the pad prior to the wire bonding process is equal to or less than 3.3 nm. In particular, in present embodiment, by adjusting the plasma condition in the plasma treatment, the surface roughness of the pad prior to the wire bonding step becomes 3.3 nm or less. At this time, the plasma condition may include high-frequency power, discharge pressure, and processing time.

In the present embodiment, the surface roughness of the pad prior to the wire bonding process is 3.3 nm or less, but the surface roughness of the pad is 3.3 nm or less even after the semiconductor device is finally completed through the subsequent process. That is, a semiconductor device manufactured by manufacturing method of semiconductor device in present embodiment includes a semiconductor chip having a pad on a surface of the semiconductor chip and a wire connected to the pad, and the surface roughness of the pad is equal to or less than 3.3 nm.

Present embodiment tries to improve the bonding strength between the pad and the ball by reducing the surface roughness of the pad to 3.3 nm or less by changing the plasma condition of the plasma treatment. Here, the original purpose of the plasma treatment is to suppress a decrease in bonding property (a decrease in pull strength (tensile strength)) caused by contamination on the surface of the inner lead at the time of second bonding in which a wire is bonded to the inner lead. Therefore, as described above, even if the plasma condition is changed, it is necessary to be able to achieve the original purpose of the plasma treatment.

In this regard, a description will be given below, with reference to the drawings, of ensuring the bonding strength between the inner lead and the wire without any problem even if the plasma condition is changed so that the surface roughness of the pad is reduced to 3.3 nm or less.

FIG. 13 is a graph showing the relationship between the tensile strength between the inner lead and the wire and the plasma condition. In FIG. 13, it is understood that even when the plasma condition is changed so as to decrease the high-frequency power or the plasma condition is changed so as to increase the discharge pressure, there is no large variation in the value of the tensile strength between the inner lead and the wire. This means that even if the plasma condition is changed so that the surface roughness of the pad is reduced to 3.3 nm or less, the bonding strength between the inner lead and the wire can be ensured without any problem. As described above, according to the present embodiment, it is possible to suppress the side effect of lowering the bonding strength between the pad and the ball caused by the plasma treatment while achieving the original object of the plasma treatment. That is, according to the characteristic point in the present embodiment, it is possible to improve the bonding strength between the pad and the ball while improving the bonding strength between the inner lead and the wire.

Further Ideas

In order to improve the bonding strength between the pad and the ball, the basic idea in present embodiment focuses not on the wire bonding process but on the plasma treatment process, which is a separate process from the wire bonding process, and adjusts the plasma condition (condition of the plasma treatment). However, in order to further improve the bonding strength between the pad and the ball, the present inventor has further devised the wire bonding process by focusing on the wire bonding process itself. Hereinafter, this aspect will also be described with reference to the drawings.

Explanation of Related Art

The "related art" referred to in the present specification is a technology having a problem newly found by the inventor, and is not a known prior art, but is a technology described with the intention of a prerequisite technology (unknown technology) of a new technical idea, although it is not a known prior art.

FIG. 14 is a diagram schematically showing a profile of a load and an ultrasonic vibration applied at the time of first bonding in which a ball is bonded to a pad in the related art.

Figure 14A:
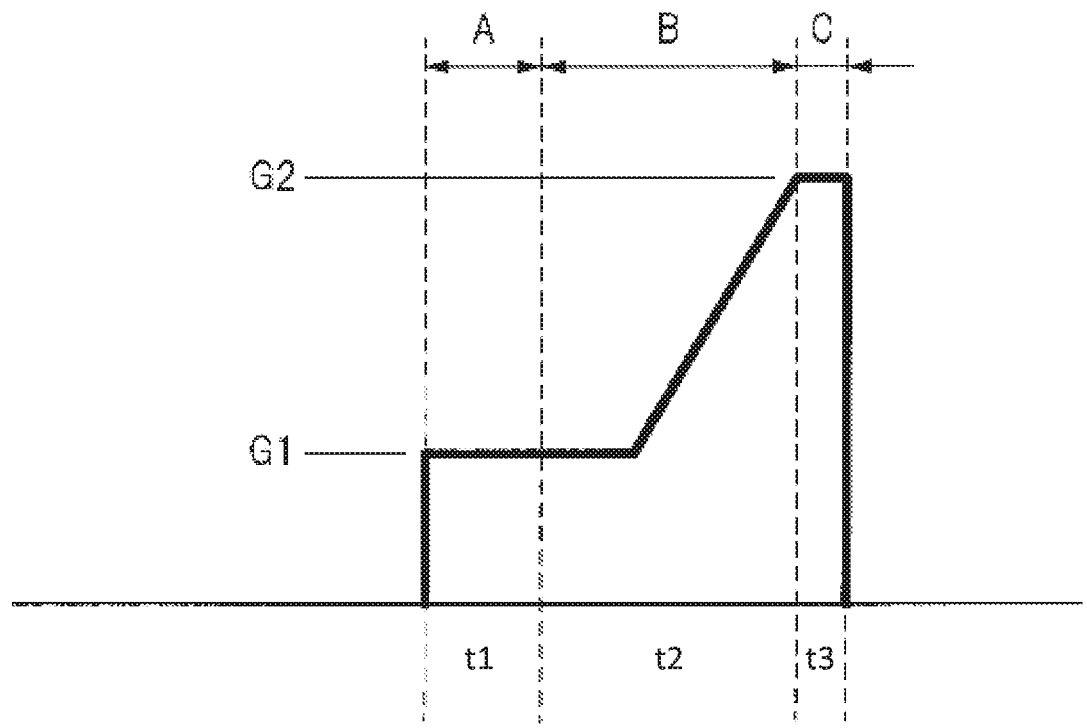
FIG. 14A is a schematic representation of a profile of the load applied to the ball.
Figure 14B:
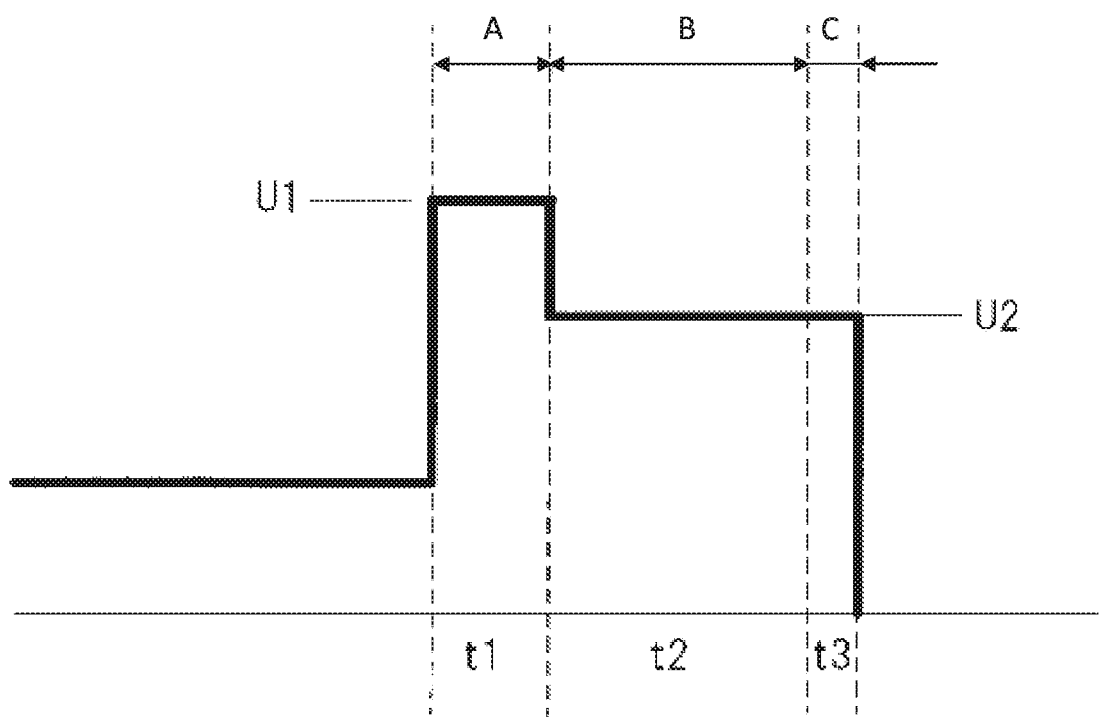
FIG. 14B is a schematic representation of a profile of the ultrasonic vibration applied to the ball.

In particular, FIG. 14A is a diagram schematically showing a profile of a load applied to the ball, and FIG. 14B, is a diagram schematically showing a profile of ultrasonic vibration applied to the ball.

Firstly, in step A (duration t1), as shown in FIG. 14A, a load G1 is applied to the ball, and as shown in FIG. 14B, ultrasonic vibration U1 is applied to the ball. More specifically, FIG. 15 shows the bonding state at the stage A of the wire bonding process. As shown in FIG. 15, by lowering the capillary CP, the ball BL formed at the tip of the wire W lands on the pad PD. At this time, a load and ultrasonic vibration are applied to the ball BL from the capillary CP, and as shown in FIG. 15, the oxide film OXF interposed between the ball BL and the pad PD is broken by the ultrasonic vibration. Thus, in the step A, i.e., the duration t1, the oxide film OXF is mainly removed.

Figure 16:
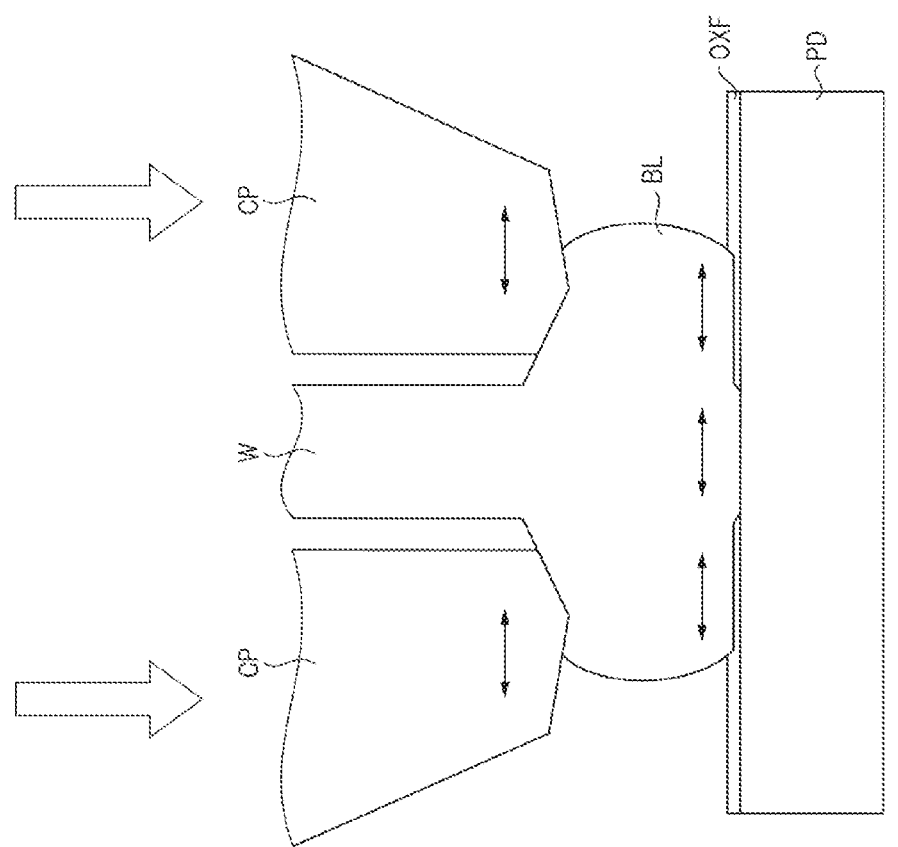
FIG. 16 shows the bonding state of the wire bonding process.

Next, in step B (duration time t2), as shown in FIG. 14A, the load applied to the ball BL is gradually increased from the load G1 to the load G2, and as shown in FIG. 14B, the ultrasonic vibration applied to the ball BL is changed to the ultrasonic vibration U2 smaller than the ultrasonic vibration U1. Specifically, FIG. 16 shows the bonding state in the stage B of the wire bonding process. As shown in FIG. 16, by pressing the capillary CP against the ball BL, the ball BL formed at the distal end portion of the wire W is deformed so as to collapse. Thus, in the stage B, i.e., the duration t2, the ball BL is mainly crushed.

Figure 17:
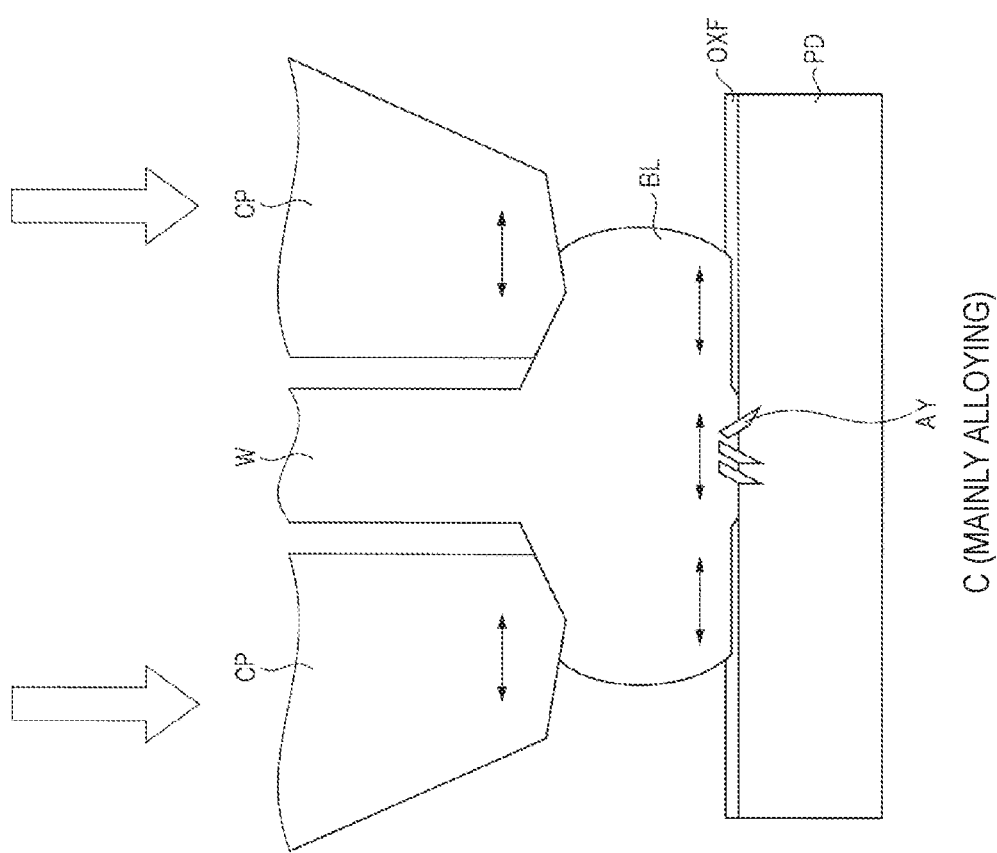
FIG. 17 shows the bonding state of the wire bonding process.

Subsequently, in step C (duration t3), as shown in FIG. 14A, the load applied to the ball BL is maintained at the load G2, and as shown in FIG. 14A, the ultrasonic vibration U2 applied to the ball BL is maintained. More specifically, FIG. 17 shows the bonding state at the stage C of the wire bonding process. As shown in FIG. 17, an alloy AY is formed in a region where the oxide film OXF is broken and the ball BL and the pad PD are in direct contact with each other. Thus, in the stage C, i.e., the duration t3, the alloy reaction mainly proceeds between the gold constituting the ball BL and the aluminum comprising the pad PD.

<<Room for Improvement Existing in Related Technology>>

The wire bonding process of the related art performed in this manner is insufficient from the viewpoint of promoting the alloy reaction between the pad PD and the ball BL.

This point will be described below. First, in the related art, a step A is carried out in which the main purpose is to remove the oxide film OXF immediately when the ball BL lands. In this case, as shown in FIG. 15, since the ball BL is not deformed so as to collapse, the contact area between the ball BL and the pad PD is small. Therefore, even if a large ultrasonic vibration U1 is applied to the ball BL at this stage, only a small amount of the oxide film OXF in contact with the ball BL is removed. That is, in the related art in which the step A, which is the main purpose of removing the oxide film OXF immediately when the ball BL lands, is performed, since the region of the oxide film OXF in contact with the ball BL is small, it becomes difficult to sufficiently remove the oxide film OXF.

Thereafter, step B is carried out with the main purpose of collapsing the ball BL. In this case, for example, as shown in FIG. 16, the oxide film OXF to which the ball BL collapses and newly comes into contact is not completely removed because it has not come into contact with the ball BL in the previous stage A. This is because the ultrasonic vibration U2 is applied to the ball BL also in the step B, and the magnitude of the ultrasonic vibration U2 is smaller than the magnitude of the ultrasonic vibration U1 applied to the ball BL in the step A mainly aimed at removing the oxide film OXF. Thus, in the related art, for example, as shown in FIG. 16, only a small portion of the collapsed ball BL comes into direct contact with the pad PD. As a result, in the step C performed after the step B, since the area in which the ball BL and the pad PD are in direct contact with each other is small, the progress of the alloy reaction between the ball BL and the pad PD becomes insufficient. As described above, in the related art, since the wire bonding process is performed in the order of the step A, the step B, and the step C, the alloy formation between the pad PD and the ball BL becomes insufficient, and the bonding strength between the pad PD and the ball BL tends to become insufficient.

Therefore, in order to further improve the bonding strength between the pad and the ball, the present embodiment has been devised with respect to the related art by focusing on the wire bonding process.

Ideas of Wire Bonding Step in Present Embodiment

FIG. 18 is a diagram schematically showing a profile of a load and ultrasonic vibration, that are applied at the time of first bonding in which the ball is bonded to pad, in the present embodiment.

Figure 18A:
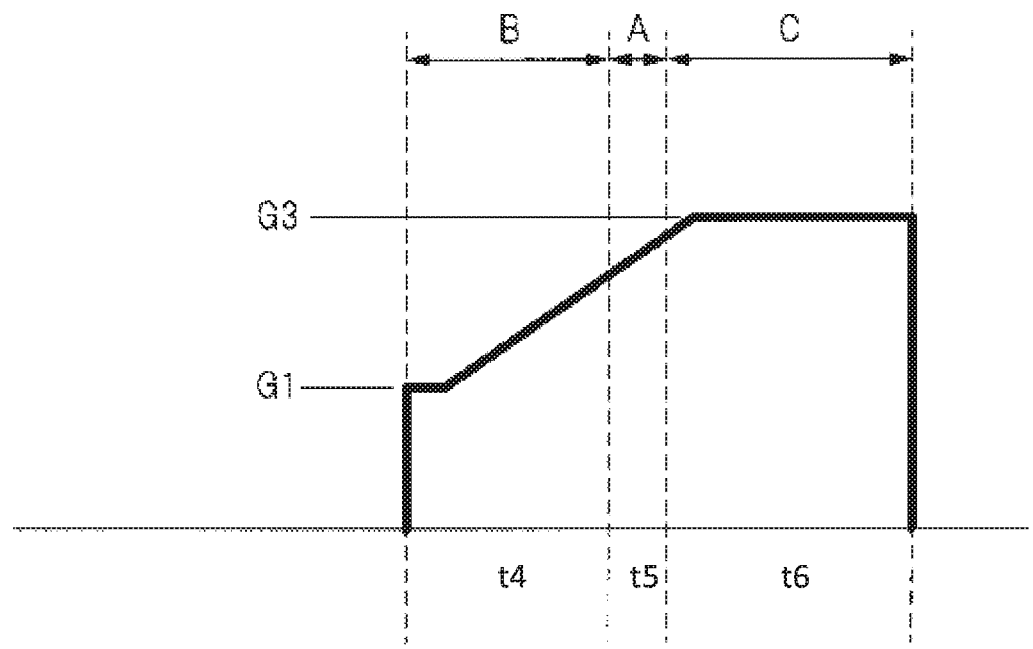
FIG. 18A is a schematic representation of a profile of the load applied to the ball.
Figure 18B:
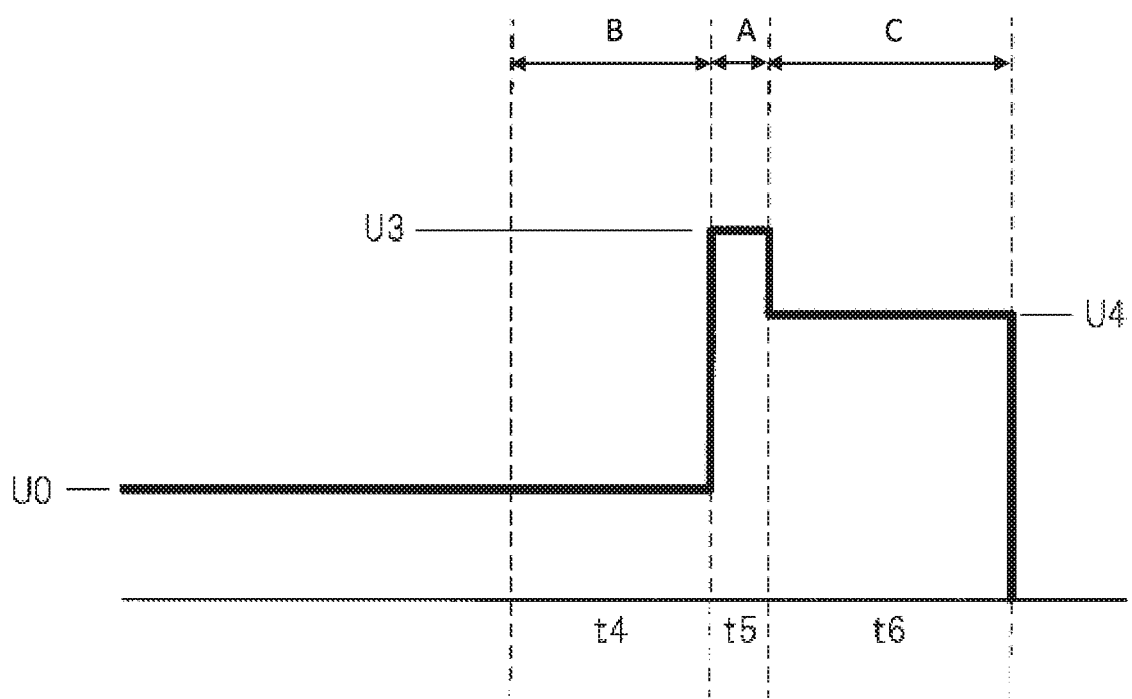
FIG. 18B is a schematic representation of a profile of the ultrasonic vibration applied to the ball.

In particular, FIG. 18A is a diagram schematically showing a profile of a load applied to the ball, and FIG. 18(b) is a diagram schematically showing a profile of ultrasonic vibration applied to the ball.

Firstly, the profile of the load and the ultrasonic vibration will be briefly described with reference to FIG. 18. That is, the wire bonding process in the present embodiment includes a process of applying the load G1 and the ultrasonic vibration U0 of the first output to the ball, a process of increasing the load while maintaining the first output, and a process of applying the ultrasonic vibration U3 of the second output larger than the first output to the ball while increasing the load. The wire bonding process in the present embodiment includes a process of applying the ultrasonic vibration U4 of the third output larger than the first output and smaller than the second output to the ball while increasing the load, and a process of continuing to apply the ultrasonic vibration U4 of the third output to the ball while maintaining the load to the load G3. Hereinafter, a concrete description will be given.

Figure 19:
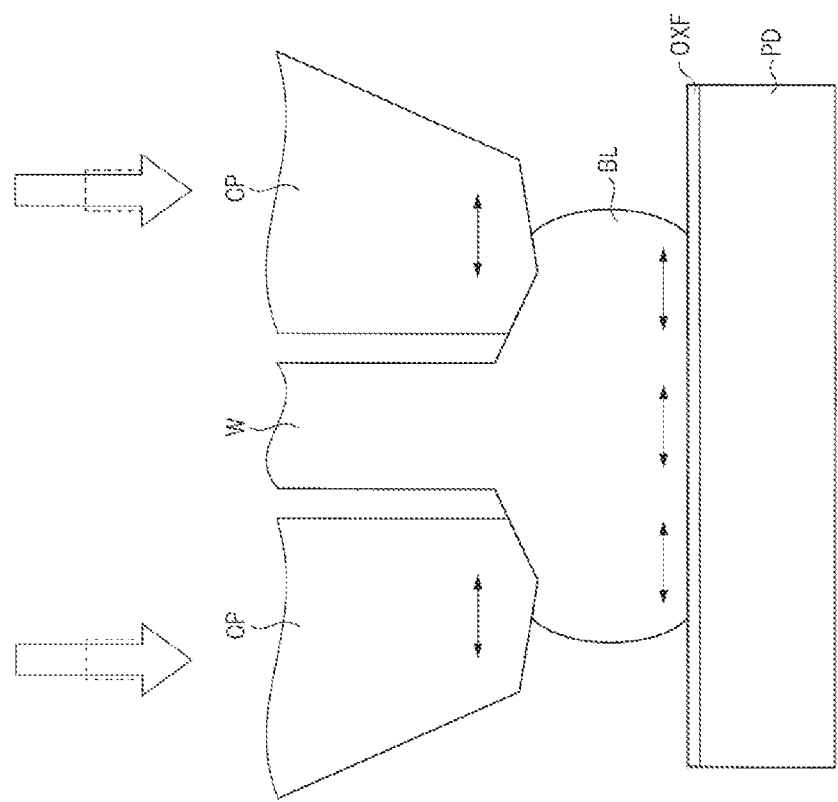
FIG. 19 shows the bonding state of the wire bonding process.

In FIG. 18, in the wire bonding process in the present embodiment, first, step B (duration t4) is performed. At this stage B (duration time t4), as shown in FIG. 18A, the load applied to the ball BL is gradually increased from the load G1, and as shown in FIG. 14B, the ultrasonic vibration applied to the ball BL is maintained at the lowest ultrasonic vibration U0. Specifically, FIG. 19 shows the bonding state in the stage B of the wire bonding process. As shown in FIG. 19, by pressing the capillary CP against the ball BL, the ball BL formed at the distal end portion of the wire W is deformed so as to collapse. Thus, in the stage B, i.e., the duration t4, the ball BL is mainly crushed. As a result, in the wire bonding process in the present embodiment, firstly, the contact area between the oxide film OXF formed on the surface of the pad PD and the ball BL is increased.

Figure 20:
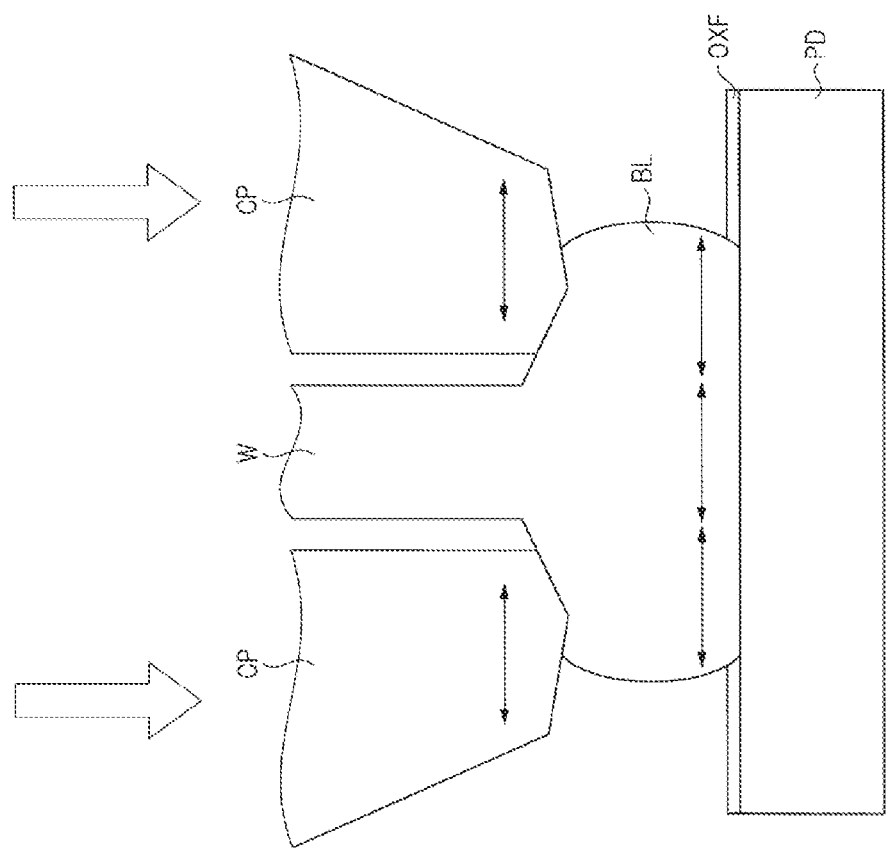
FIG. 20 shows the bonding state of the wire bonding process.

Next, as shown in FIG. 18, in the wire bonding process in the present embodiment, step A (duration t5) is performed after step B. In this stage A, as shown in FIG. 18A, the load applied to the ball is further increased to the load G3, and as shown in FIG. 18B, the ultrasonic vibration U3 larger than the ultrasonic vibration U0 is applied to the ball. Specifically, FIG. 20 shows the bonding state in the stage A of the wire bonding process. As shown in FIG. 20, a load and ultrasonic vibration are applied to the ball BL from the capillary CP, and the oxide film OXF interposed between the ball BL and the pad PD is broken by the ultrasonic vibration. Thus, in the step A, i.e., the duration t5, the oxide film OXF is mainly removed. At this time, in the wire bonding process in the present embodiment, the step B, which is the main purpose of crushing the ball BL, has been performed before the step A, which is the main purpose of removing the oxide film OXF, has been performed. Therefore, as shown in FIG. 20, a large ultrasonic vibration is applied in a state where the contact area between the ball BL and the oxide film OXF is large. Therefore, in the present embodiment, the oxide film OXF contacting the collapsed ball BL can be sufficiently removed.

Figure 21:
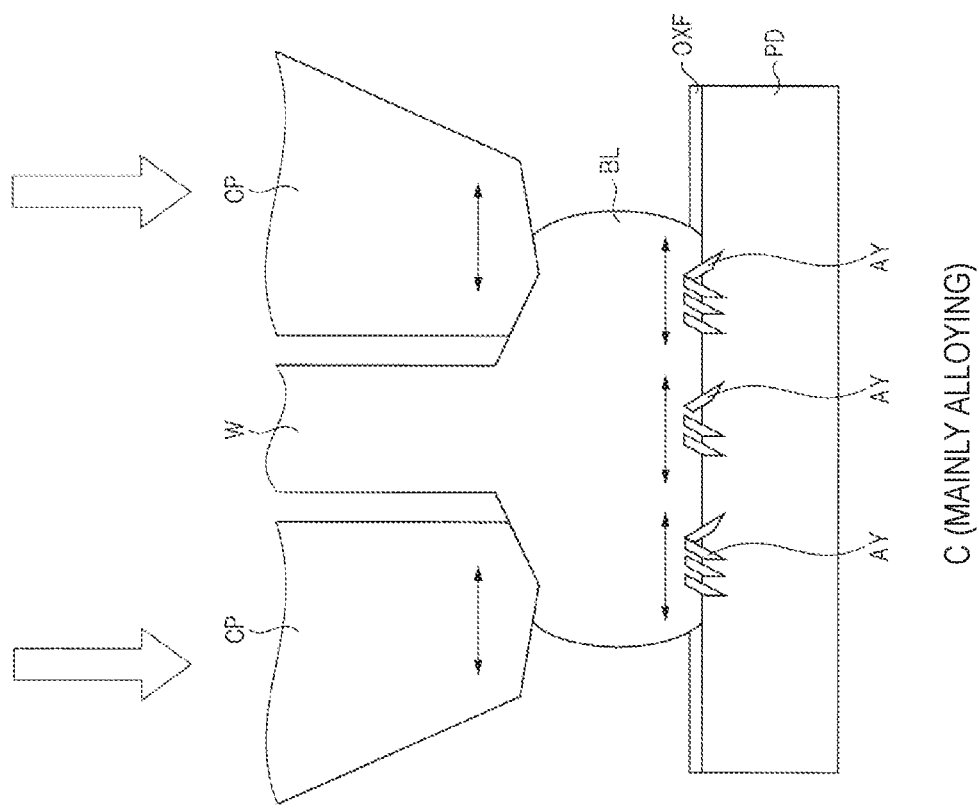
FIG. 21 shows the bonding state of the wire bonding process.

Subsequently, in the wire bonding process in the present embodiment, step C (duration t6) is performed after step B. In this stage C, as shown in FIG. 18A, the load applied to the ball BL is maintained at the load G3, and as shown in FIG. 18B, the ultrasonic vibration U4 smaller than the ultrasonic vibration U3 is applied to the ball BL. Specifically, FIG. 21 shows the bonding state in the stage C of the wire bonding process. As shown in FIG. 21, most of the oxide film OXF in contact with the collapsed ball BL is broken, and the ball BL and the pad PD are in direct contact with each other. In a region where the ball BL and the pad PD are in direct contact with each other, an alloy AY is formed. As described above, in the step C, the alloy reaction mainly proceeds between the gold constituting the ball BL and the aluminum comprising the pad PD. Here, in the wire bonding process in the present embodiment, since the region where the ball BL and the pad PD are in direct contact with each other becomes large, the alloying reaction between the ball BL and the pad PD is promoted. Furthermore, in the wire bonding process in the present embodiment, the duration t6 of the stage C is the longest among the stages B (duration t4), A (duration t5), and C (duration t6). This means that the wire bonding process in present embodiment spends more time alloying than in the related art, given that stage C is primarily aimed at alloying. As described above, in the wire bonding process in the present embodiment, the oxide film OXF is sufficiently removed, and the alloying reactions between the ball BL and the pad PD are sufficiently promoted by the synergistic effects of the large area of the area where the ball BL and the pad PD are in direct contact with each other and the longer time spent for alloying. Therefore, in the wire bonding process in the present embodiment, the bonding strength between the pad PD and the ball BL can be improved as compared with the related art. That is, in the present embodiment, the wire bonding process is performed in the order of step B→step A→step C, and the required time of step C is the longest, so that the alloying between the pad PD and the ball BL can be sufficiently formed, and as a result, the bonding strength between the pad PD and the ball BL can be improved.

The invention made by the present inventor has been described above in detail based on the embodiment, but the present invention is not limited to the embodiment described above, and it is needless to say that various modifications can be made without departing from the gist thereof.

The embodiment includes the following aspects.

(Additional Statement 1)

A method of manufacturing a semiconductor device, comprising the steps of:

(a) performing a plasma treatment against a semiconductor chip having a pad thereon and mounted on a chip mounting portion; and (b) after the step (a), electrically connecting a wire with the pad, wherein a connecting strength between the pad and the wire is improved on the basis of a condition of the plasma treatment.

(Additional Statement 2)

The method according to the additional statement 1, wherein the alloying reaction between the pad and the wire is promoted on the basis of the condition of the plasma treatment.

(Additional Statement 3)

The method according to the additional statement 2, wherein the condition of the plasma cleaning is high-frequency power.

(Additional Statement 4)

The method according to the additional statement 2, wherein the condition of the plasma cleaning is discharge pressure.

(Additional Statement 5)

The method according to the additional statement 2, wherein the condition of the plasma cleaning is processing time.

What is claimed is:

1. A method of manufacturing a semiconductor device, comprising the steps of:

(a) performing a plasma cleaning against a semiconductor chip having a pad thereon; and
(b) after the step (a), electrically connecting a wire with the pad,
wherein a surface roughness of the pad after the step (a) is equal to or less than 3.3 nm.

2. The method according to claim 1, wherein the pad having the surface roughness is formed by adjusting a condition of the plasma cleaning in the step (a).

3. The method according to claim 2, wherein the condition of the plasma cleaning is high-frequency power.

4. The method according to claim 2, wherein the condition of the plasma cleaning is discharge pressure.

5. The method according to claim 2, wherein the condition of the plasma cleaning is processing time.

6. The method according to claim 1,
wherein the pad is comprised of aluminum as a main component, and
wherein the wire is comprised of gold as a main component.

7. The method according to claim 1, wherein the step (b) has the following steps (b1)-(b3):
(b1) forming a ball at a tip portion of the wire;
(b2) contacting the ball with the pad; and
(b3) applying a load and an ultrasonic vibration to the ball.

8. The method according to claim 7, wherein the step (b3) has the following steps (b3-1)-(b3-5):
(b3-1) applying a first load and a first ultrasonic vibration of a first output power to the ball;
(b3-2) increasing the first load, while keeping the first output power;
(b3-3) applying a second ultrasonic vibration of a second output power, that is larger than the first output power, to the ball, while increasing the first load;
(b3-4) applying a third ultrasonic vibration of a third output power, that is larger than the first output power, and that is smaller than the second output power, to the ball, while increasing the first load; and
(b3-5) further applying the third ultrasonic vibration to the ball, while keeping the first load increased in the step (b3-4) as a second load.

9. The method according to claim 8, wherein a processing time for the step (b3-5) is the longest time in the step (b3).

10. A method of manufacturing a semiconductor device, comprising the steps of:

(a) performing a plasma cleaning against a semiconductor chip having a pad thereon; and
(b) after the step (a), electrically connecting a wire with the pad,
wherein an oxide film having a thickness, which is equal to or less than 3.3 nm, is formed on a surface of the pad before performing the step (b).

11. The method according to claim 10, wherein the oxide film having the thickness is formed by adjusting a condition of the plasma cleaning in the step (a).

12. The method according to claim 11, wherein the condition of the plasma cleaning is high-frequency power.

13. The method according to claim 11, wherein the condition of the plasma cleaning is discharge pressure.

14. The method according to claim 11, wherein the condition of the plasma cleaning is processing time.

15. The method according to claim 10,
wherein the pad is comprised of aluminum as a main component, and
wherein the wire is comprised of gold as a main component.

16. The method according to claim 10, wherein the step (b) has the following steps (b1)-(b3):
(b1) forming a ball at a tip portion of the wire;
(b2) contacting the ball with the pad; and
(b3) applying a load and an ultrasonic vibration to the ball.

17. The method according to claim 16, wherein the step (b3) has the following steps (b3-1)-(b3-5):
(b3-1) applying a first load and a first ultrasonic vibration of a first output power to the ball;
(b3-2) increasing the first load, while keeping the first output power;
(b3-3) applying a second ultrasonic vibration of a second output power, that is larger than the first output power, to the ball, while increasing the first load;
(b3-4) applying a third ultrasonic vibration of a third output power, that is larger than the first output power, and that is smaller than the second output power, to the ball, while increasing the first load; and
(b3-5) further applying the third ultrasonic vibration to the ball, while keeping the first load increased in the step (b3-4) as a second load.

18. The method according to claim 17, wherein a processing time for the step (b3-5) is the longest time in the step (b3).

* * * * *